United States Patent [19]
Miyahara et al.

[11] Patent Number: 5,940,268
[45] Date of Patent: Aug. 17, 1999

[54] HEAT SINK AND ELECTRONIC DEVICE EMPLOYING THE SAME

[75] Inventors: Masaharu Miyahara, Nakatsu; Yasushi Inoue, Usa; Kenji Suga, Nakatsu, all of Japan

[73] Assignee: Matsushita Electric Industrial Co. Ltd., Osaka, Japan

[21] Appl. No.: 08/831,430

[22] Filed: Apr. 1, 1997

[30] Foreign Application Priority Data

Apr. 4, 1996 [JP] Japan .................................. 8-082306

[51] Int. Cl.$^6$ ...................................................... H65K 7/20
[52] U.S. Cl. ........................ 361/697; 165/80.3; 165/121; 165/185
[58] Field of Search .................... 165/80.3, 121, 165/122, 185; 361/697, 704, 707; 415/177, 178, 208.3, 213.1

[56] References Cited

U.S. PATENT DOCUMENTS 5,526,875  6/1996  Lin .......................................... 361/697

FOREIGN PATENT DOCUMENTS 5304379  11/1993  Japan .

*Primary Examiner*—Gregory Thompson
*Attorney, Agent, or Firm*—Stevens, Davis, Miller & Mosher, L.L.P.

[57] ABSTRACT

A fan-motor-incorporated heat sink effectively supplies cooling air flow in a thin electronic device having limited space above the heat sink. The heat sink enables air intake above the heat sink by positioning a fan, the fins of a heat sink substrate and the side wall of the substrate lower than the fan driving unit. The heat sink substrate and the fins are formed such that air is exhausted only in one direction. A cover is provided on the side of the heat sink substrate on which the fan driving unit is mounted and to which air is taken in to prevent exhausted air from being taken in. The structure of the electronic device is positioned close to the upper surface of the fan driving unit on the heat sink. Thus, the heat sink can be installed on a thin electronic device while improving the cooling of a heat emitting element.

11 Claims, 4 Drawing Sheets

HEAT SINK AND ELECTRONIC DEVICE EMPLOYING THE SAME

BACKGROUND OF THE INVENTION

1. Field of the Invention

The present invention relates to a heat sink for cooling a semiconductor element which emits much heat such as a micro processing unit (referred to as an MPU hereinafter).

2. Description of the Prior Art

Heat sinks have been used for cooling semiconductors and the like which emit much heat. Recently, in particular, a fan-motor-integrated heat sink incorporated with a small fan is used for coping with the high heat emission of the MPU etc.

Conventional heat sinks will be described hereinafter. FIG. 8 is a perspective view of a conventional heat sink and FIG. 9 is a cross sectional view of the conventional heat sink.

In FIGS. 8 and 9, reference numeral 81 denotes an MPU that is a high-exothermic semiconductor element, 82 a heat sink substrate which is mounted on the MPU 81, 83 radiator fins, 84 driving means such as a motor or the like, 85 a fan and 86 a structure such as the casing of a notebook-type personal computer etc. for defining a space above the heat sink.

The operation of a conventional fan-motor-integrated heat sink having the aforementioned structure will be described hereinafter. Heat emitted from the MPU 81 is transmitted to the heat sink substrate 82 and the radiator fins 83. Air flow generated by the fan 85 rotated by the driving means 84 is taken in between the structure and the upper surface of the heat sink as shown by an arrow A and passes among the radiator fins 83 while carrying off heat therefrom to be vented from the side surface thereof as shown by an arrow B.

The aforementioned conventional structure had a problem that it was impossible for thin devices such as the notebook-type personal computer limited in thickness to secure a sufficient space for taking in air from above the heat sink and consequently to secure a sufficient cooling performance. Although the entire heat sink may be made thin for securing sufficient space, a motor capable of rotating the fan to generate a sufficient amount of air flow for cooling the device required a certain degree of thickness because of the structure of its bearing and coil, so that the motor was structurally limited in being made thin.

SUMMARY OF THE INVENTION

An object of the present invention is to provide a fan-motor-integrated heat sink capable of effectively supplying cooling air flow to an element even if the same is a heat emitting element such as an MPU etc. employed by a thin device which cannot secure a sufficient space above the heat sink.

In order to attain the above object, the present invention obtains a sufficient space for taking in air between the upper surface of the heat sink and the casing of a device by making the height of the fan and those of the fins of the heat sink lower than the height of the upper surface of the fan driving means such as a motor which is structurally limited in thickness relative to the heat sink substrate. Furthermore, the heat sink substrate and the fins are formed such that air is vented only in one direction to compensate for the reduction of cooling performance caused by miniaturizing the fan and the fins of the heat sink substrate, and a cover is provided on the inlet side to prevent the vented air from being taken in.

This structure enables arranging a structure above the heat sink nearly as low as the height of the motor and consequently mounting the heat sink on a thin device.

DESCRIPTION OF THE PREFERRED EMBODIMENTS

The preferred embodiments of the present invention will be described hereinafter with reference to FIGS. 1 to 7.

Figure 1:
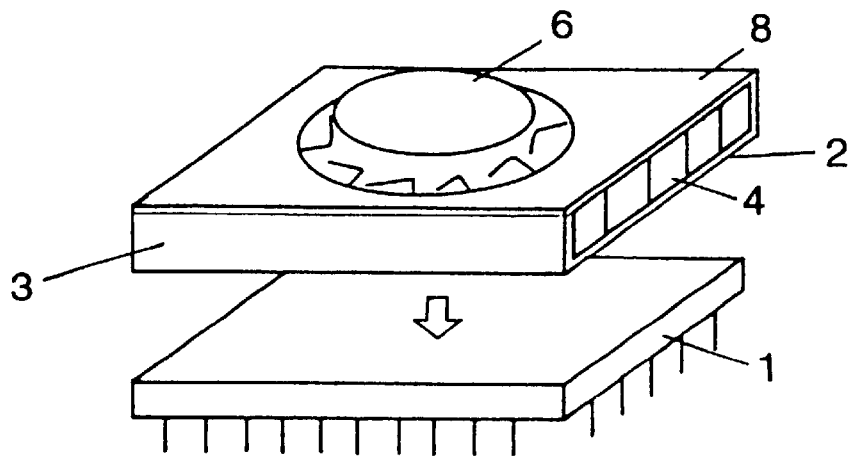
FIG. 1 is a perspective view of a heat sink according to a first embodiment of the present invention.
Figure 2:
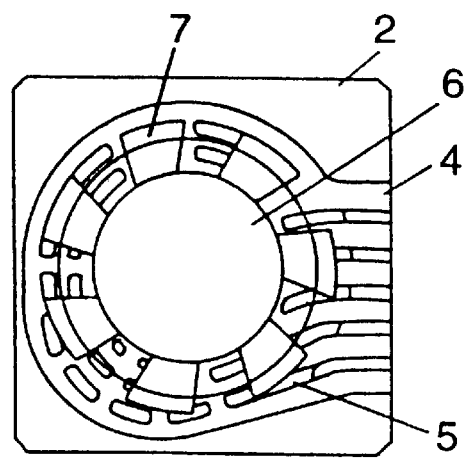
FIG. 2 is a plan view of the heat sink according to the first embodiment of the present invention shown in FIG. 1.
Figure 3:
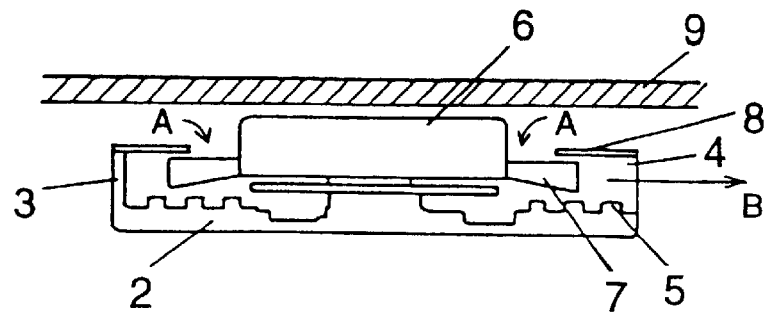
FIG. 3 is a cross-sectional view of the heat sink according to the first embodiment of the present invention.

FIG. 1 is a perspective view of a heat sink according to a first embodiment of the present invention, FIG. 2 is a plan view of the heat sink according to the first embodiment of the present invention, and FIG. 3 is a cross-sectional view of the heat sink according to the first embodiment of the present invention.

In FIGS. 1, 2 and 3, reference numeral 1 designates a heat emitting element such as an MPU or the like on which a heat sink is mounted for cooling, the heat emitting element 1 having, for example, in case of an MPU, usually a shape of a quadrangle such as a square, a rectangle or the like having a side of 40 mm to 50 mm. Numeral 2 is a heat sink substrate, which is substantially square-shaped in outline almost similar to the heat emitting element 1 and which may be made of resin such as plastics without being limited to metals such as aluminum, brass, etc. so long as it is high in thermal conductivity as a member. The heat sink substrate 2 may be in outline of other shapes such as a circle as needed. The heat sink substrate 2 having a flat edge surface is mounted on the heat emitting element 1 according to a fixing method, using a bond, hooks, screws, etc. such that the flat side thereof is in contact with the upper surface of the heat emitting element 1. A side wall 3 is provided on three other edge surfaces of the heat sink substrate 2, the side wall 3 being provided along the edge surfaces of the heat sink substrate 2 at the outer side thereof and being substantially circular around the rotating axis of a fan 7, described later, at the inner side thereof. The side wall 3 defines the direction of air flow and the blowing-out direction thereof and serves as a fin as well. An edge of the heat sink substrate 2 where no side wall 3 is provided becomes an outlet 4. Numeral 5 designates a plurality of radiator fins, which are provided substantially in parallel to the flowing out direction of air in the vicinities of the outlet 4 while substantially in circular arcs each having a predetermined length with its center at the rotating axis of the fan 7, described later, in other places.

Although they are arranged substantially in circular arcs according to this embodiment, they may be arranged substantially along a spiral. Numeral 6 is a motor serving as driving means, which motor 6 is fixed to the surface of the heat sink substrate 2 on which the radiator fins 5 are provided according to a fixing method using a bond, screws, press fitting, etc.

Numeral 7 designates an axial fan rotated by the motor 6, which fan 7 is arranged inside the side wall 3 for generating air flow to take in and blow out air. The fan 7 is made of metal having high thermal conductivity such as aluminum etc. for enhancing radiator effect. Incidentally, it may be made of resin such as plastics etc., not being limited to metal so long as it is high in thermal conductivity as a member. Numeral 8 is a cover for covering the edges of the heat sink substrate 2 where the side wall 3 is provided, which cover 8 has an opening larger in diameter than the outer diameter of the motor 6 and smaller than the outer diameter of the fan 7 and which is mounted on the side wall 3 of the heat sink substrate 2 using a bond, screws, pressure welding etc. Numeral 9 designates a structure such as the casing of a notebook-type personal computer for regulating space above the heat sink.

The side wall 3 is smaller in height than the motor 6. The fan 7 is provided on the side surface of the motor 6 being shifted toward the lower end thereof, such that the upper surface of the fan 7 is lower than the upper surface of the motor 6, being in height between the heat sink substrate 2 and the cover 8. The fins 5 are so high as not to touch the fan 7 thereunder while being substantially as high as the side wall 3 in the vicinity of the outlet 4 and outside the fan 7. As shown in FIG. 3, even if the structure 9 is designed to be arranged close to the upper surface of the motor 6, there exists a sufficient space into which air flows between the structure 9 and the cover 8, so that it is possible to generate a smooth air flow by the rotation of the fan 7.

The operation of the heat sink having the above structure will be described with reference to drawings.

In FIG. 3, heat generated in the heat emitting element 1 is transmitted to the heat sink substrate 2, the side wall 3, the radiator fins 5 and the cover 8. Air flow generated by the fan 7 rotated by the motor 6 is taken in from above the heat sink as shown by an arrow A, passes through the opening of the cover 8 and among the fins 5 while carrying off heat therefrom toward the outlet 4 and is vented from the side surface of the heat sink as shown by an arrow B. Even in case that the upper structure 9 is arranged as close as possible to the upper surface of the motor 6 in order to make the device thin, the structure of the present invention can secure an inflow route of air since it can afford a space above the cover 8. A conventional structure employing a motor having the same thickness cannot secure a comparable amount of air flow since the inflow route is blocked although the fan is exposed to the outside to a greater extent than the structure of the present invention. In addition, in case that the motor itself is made thin in the conventional structure, the inflow route of air can be secured but the reduction of motor output cannot be avoided, so that the amount of air flow is reduced. Thus with the structure of the present invention, an effective cooling becomes possible since the inflow route of air is secured without reducing the motor output.

Figure 9:
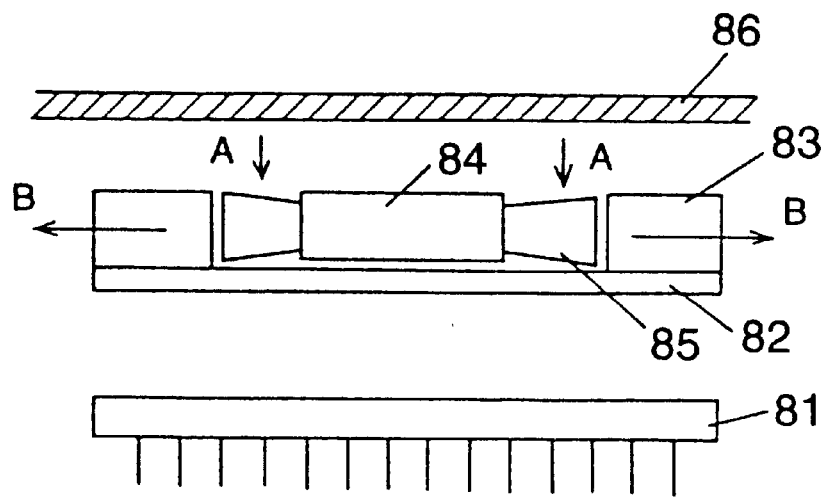
FIG. 9 is a cross-sectional view of the conventional heat sink.

Next, the operation of the cover 8 will be described with reference to FIG. 3 as well. In a heat sink having the above structure, the fan 7 can have either of the structure of an axial fan or that of a centrifugal fan. However, since the advantage of the heat sink according to the present invention resides in being able to be made thin and it is mainly used for cooling the semiconductor elements in a thin electronic device, the outer dimension of the heat sink is about 40 mm in side length and about 10 mm in height. Therefore, the dimension of the fan in height needs to be limited to about 5 mm in order to secure a sufficient route for air flow between the upper surface of the heat sink and the structure 9. In addition, the length of a fan blade needs to be limited to about 30 mm. Although a conventional heat sink as shown in FIG. 9 usually employs a centrifugal fan such as a scirocco fan for taking in air from above and venting it in a side direction, the present invention employs an axial fan since a sufficient blade length cannot be obtained for the centrifugal fan. Without the cover 8, air flow directed downward by the fan 7 is reversed in flowing direction by the heat sink substrate 2 to escape toward the inlet through spaces among the blades of the fan 7 or through space between the fan 7 and the inner wall of the heat sink substrate 2. Providing the cover 8 to cover a part of the fan 7 is effective for restraining such escape. In case that the diameter of the opening of the cover 8 is larger than the envelope of the tip ends of the fan 7, a larger amount of air escapes toward the inlet. Alternatively, in case that the diameter of the opening of the cover 8 is much smaller than the envelope of the tip ends of the fan 7, the small area of the inlet opening reduces the amount of inflow air. In practical use, since the performance varies depending on the structure inside the device such as the structure 9, the opening dimension is set to be optimal to the device.

Incidentally, although the motor 6 is mounted on the heat sink substrate 2 according to this embodiment, it may be mounted on the cover 8 so as to be mounted on the heat sink substrate 2 by way of the cover 8.

Figure 4:
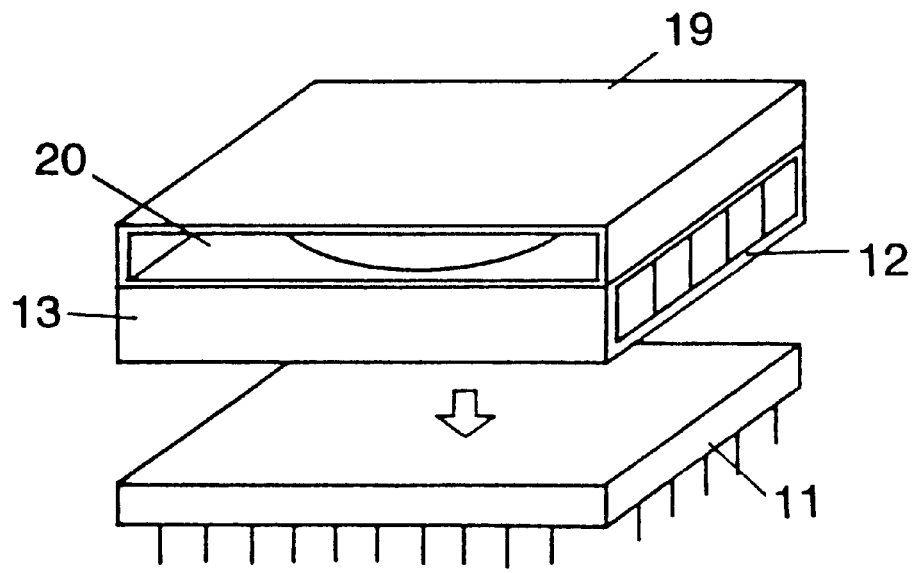
FIG. 4 is a perspective view of a heat sink according to a second embodiment of the present invention.
Figure 5:
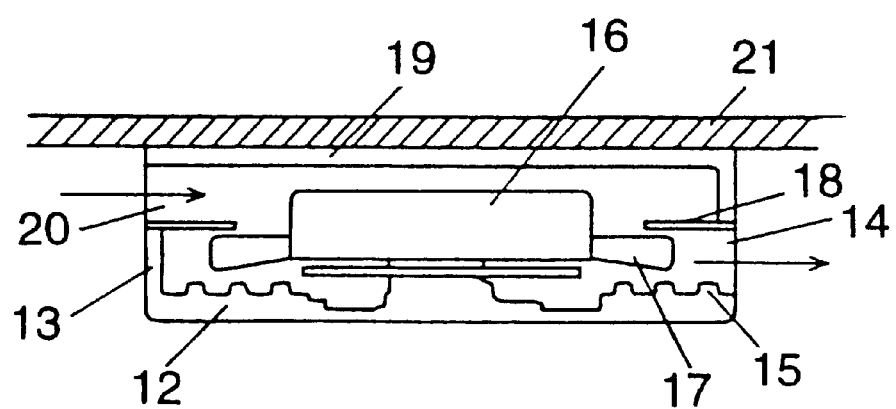
FIG. 5 is a cross-sectional view of the heat sink according to the second embodiment of the present invention.

A second embodiment will now be described. FIG. 4 is a perspective view of a heat sink according to the second embodiment of the present invention, and FIG. 5 is a cross-sectional view of the heat sink according to the second embodiment of the present invention.

Reference numeral 11 designates a heat emitting element such as an MPU etc. on which the heat sink is mounted for cooling, 12 is a heat sink substrate, 13 designates a side wall provided on three edge surfaces of the heat sink substrate 12, 14 designates an outlet for blowing out air formed on an edge surface of the heat sink substrate 12 where no side wall 13 is provided, 15 designates a plurality of radiator fins integrally provided with the heat sink substrate 12, 16 is a motor serving as driving means, 17 is an axial fan rotated by the motor 16, 18 is a first cover for covering the edges of the heat sink substrate 12 where the side wall 13 is provided, and 21 designates a structure such as the casing of a notebook-type personal computer for regulating a space above the heat sink. The components described above are similar to those according to the first embodiment, so that the description thereof is omitted. Numeral 19 is a second cover which is substantially quadrangular and concave in outline and one side of which is open with an inlet 20 for determining the inflow direction of air. The second cover 19 is mounted on the heat sink substrate 12 such that the inlet 20 is directed in a predetermined direction relative to the heat sink substrate 12.

The operation of the heat sink having the above structure according to the second embodiment will be described with reference to FIGS. 4 and 5. The heat sink substrate 12, the outlet 14, the fins 15, the motor 16, the fan 17 and the first cover 18 have the same structures as those of the first embodiment set forth above, and the second cover 19 is mounted thereon. The second cover 19 has the inlet 20 at one edge surface thereof, from which air is taken in by the rotation of the fan 17 and is blown out from the outlet 14 while passing among the fins 15 to carry off heat therefrom. The second cover 19 can be mounted on the heat sink substrate 12 such that the inlet 20 is directed in a predetermined direction, thereby realizing a heat sink which takes in air from a predetermined direction and vents the air in a predetermined direction. Thus, in case that it is necessary to cool parts emitting large amounts of heat inside a device equipped with the heat sink, it is possible to take in air from an optimal direction, thereby enabling the optimization of the effect of cooling the entire casing containing an MPU and the like. In addition, the structure 21 provided in the casing of a notebook-type personal computer etc. for regulating a space above the heat sink can sufficiently secure the inflow route of air even if it is in contact with the upper surface of the second cover 19, thereby eliminating the variation of performance due to the space between the heat sink and the structure 21 to facilitate designing the device.

It is possible to mount the second cover 19 on the heat sink substrate and take in air from a direction also in the conventional structure, but the thickness of the heat sink substrate increases by that of the second cover 19. In case that the second cover 19 is mounted on the heat sink according to the second embodiment of the present invention, it is possible to arrange the motor 16 and the second cover 19 closely to each other, thereby realizing a thin heat sink capable of taking in air from a particular direction and venting the air in one direction. Devices requiring the one-direction air taking and the one-direction air venting are mainly thin devices limited in space, so that the thin one-direction air taking and one-direction air venting heat sink having the structure of the present invention can realize a large effect.

Figure 6:
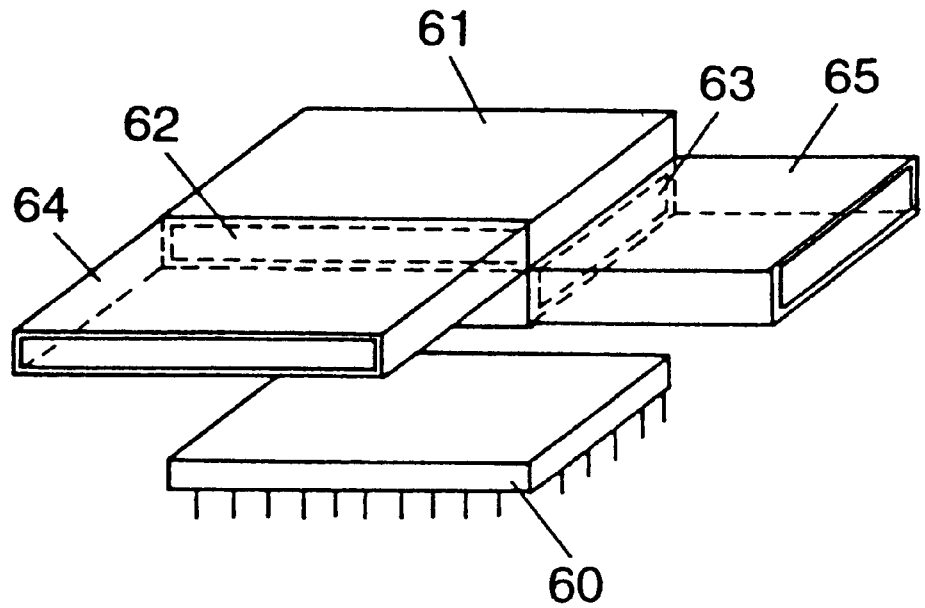
FIG. 6 is a perspective view of a heat sink according to a third embodiment of the present invention.

Now, a third embodiment will be described. FIG. 6 is a perspective view of a heat sink according to the third embodiment of the present invention, and FIG. 7 is a view showing the inside of an electronic device in which a heat sink according to the third embodiment of the present invention is incorporated.

Reference numeral 60 designates a heat emitting element, 61 is a heat sink similar to that of the second embodiment, 62 is an inlet provided in the heat sink 61 for taking in air, 63 designates an outlet provided in the heat sink 61 for venting air therefrom, 64 is a first duct connected to the inlet 62, and 65 is a second duct connected to the outlet 63. Although the figure illustrates the first duct 64 and the second duct 65 each having a rectangular cross section similar to that of the inlet 62 or that of the outlet 63, they can have any shape; for example, it is also possible that the tip end of the first duct 64 at the side of taking in air has a shape laterally wider than the inlet 62 and the tip end of the second duct 65 at the side of venting air has a shape of a circle or the like larger than the outlet 63. Alternatively, the duct can be provided only at either of the inlet 62 or the outlet 63. In FIG. 7, reference numeral 70 designates the casing of an electronic device, 71 is a printed board on which electronic parts, heat emitting elements etc. are arranged to constitute an electric circuit, and 72 is a heat emitting device such as a power supply. The first duct 64 at the side of the inlet 62 has its opening in the vicinity of the heat emitting element 72 such as the power supply inside the electronic device, while the second duct 65 at the side of the outlet 63 has its opening at the exhaust port of the casing 70 of the electronic device. Air flow generated by the heat sink 61 takes in air around the heat emitting element 72 through the first duct 64, passes through the heat sink 61 and is vented from the casing of the electronic device through the second duct 65.

The operation of the heat sink having the above structure according to the third embodiment will be described with reference to FIGS. 6 and 7.

Figure 7:
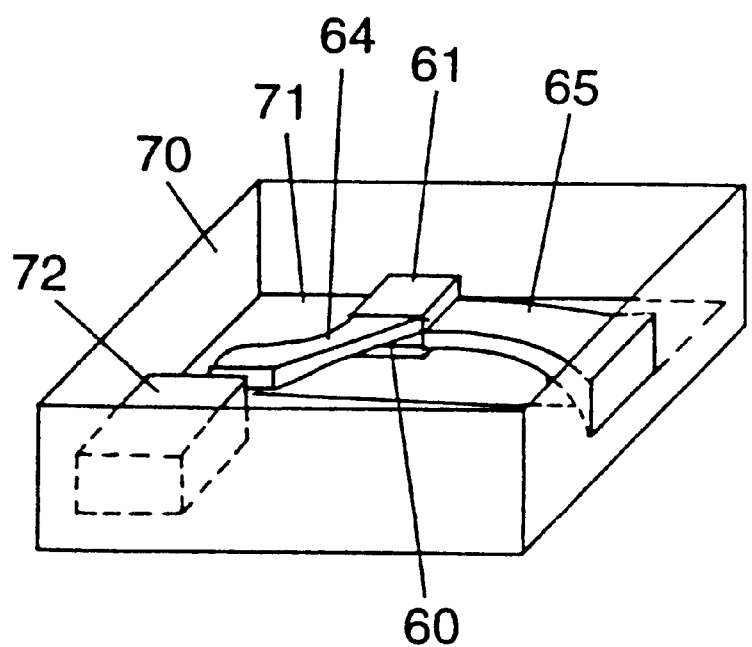
FIG. 7 is a view showing the inside of an electronic device which incorporates therein the heat sink according to the third embodiment of the present invention.
Figure 8:
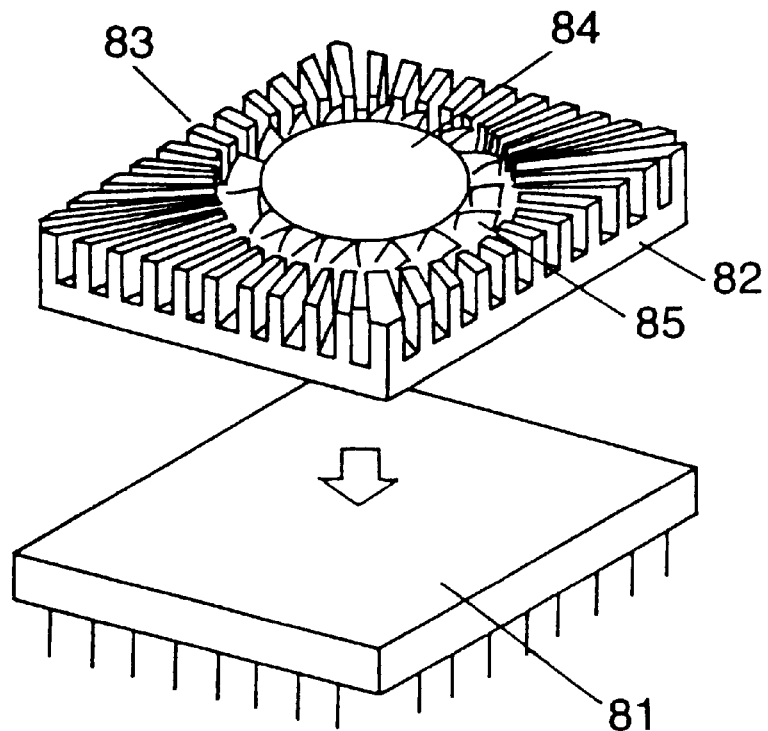
FIG. 8 is a perspective view of a conventional heat sink.

As shown in FIG. 7, providing the first duct 64 and the second duct 65 in the heat sink enables taking in air at a predetermined position from a predetermined direction and venting the air to a predetermined position in a predetermined direction, thereby eliminating the restriction in the direction and position in taking in and venting air caused by the position of the MPU or that of the printed board. Without the first duct 64 at the inlet side, the heat sink 61 only takes in air on the printed board 71, but providing the opening of the first duct 64 in the vicinity of a specific component, for example, the power supply 72, enables taking air as well as cooling the power supply 72. In addition, providing the opening of the second duct 65 at the exhaust port of the casing 70 enables discharging the heat of the heat emitting element 60 or that of the power supply 72 from the casing with certainty, thereby preventing the heat from diffusing therein. It is also possible to eliminate the necessity of additionally providing a fan for exhausting air other than the heat sink in the casing, thereby simplifying the structure.

The present invention can be embodied in other various forms without departing from the spirit or main features thereof. Therefore, the preferred embodiments set forth above are illustrated only by way of examples in all respects, and should not be interpreted by way of limitation. The scope of the present invention is represented by the scope of the claims for a patent but not restrained by the specification at all. Furthermore, the modifications or variations belonging to the equivalent of the scope of the claims for a patent are all within the scope of the present invention.

What is claimed is:

1. A heat sink comprising:
   a substrate having a floor and a vertical side wall open in one direction;
   a plurality of fins vertically projecting from said floor of said substrate;
   driving means at least a part of which is supported by said floor of said substrate; and
   a fan rotated by said driving means wherein:
      a height of an upper surface of said side wall is lower than that of an upper surface of said driving means relative to said floor of said substrate.

2. A heat sink according to claim 1, characterized in that the fan has a shape of an axial fan.

3. A heat sink according claim 1, wherein said driving means has a housing and said height of said upper surface of said side wall is lower than the height of an upper surface of said housing of said driving means relative to said floor of said substrate.

4. A heat sink comprising:
   a substrate having a floor and a vertical side wall open in one direction;
   a plurality of fins vertically projecting from said floor of said substrate;
   driving means at least a part of which is supported by said substrate;
   a fan rotated by said driving means; and
   a plate mounted on an upper surface of said side wall and having an opening, wherein:
      a height of said upper surface of said side wall and a height of an upper surface of said plate are lower than that of an upper surface of said driving means relative to said floor of said substrate.

5. A heat sink according to claim 3, characterized in that the opening of the plate is so large as to allow the driving means to penetrate the plate through said opening but smaller in diameter than the fan.

6. A heat sink according to claim 5, characterized in that the fan has a shape of an axial fan.

7. A heat sink according to claim 4, characterized in that the fan has a shape of an axial fan.

8. A heat sink comprising:

a substrate having a floor;

a plurality of fins vertically projecting from said floor of said substrate;

driving means at least a part of which is supported by said substrate;

a fan rotated by said driving means;

a plate having an opening; and a vertical side wall structure disposed between said substrate and said plate, said vertical side wall structure being open in one direction, said plate being positioned at an upper surface of said side wall structure, said plate and said side wall structure forming a frame having a height which is lower than a height of an upper surface of said driving means relative to said floor of said substrate.

9. A heat sink according to claim 8, wherein said opening of said plate is sufficiently large to allow said driving means to penetrate said plate but smaller in diameter than said fan.

10. A heat sink according to claim 8, wherein said fan has the shape of an axial fan.

11. A heat sink according to claim 9, wherein said fan has the shape of an axial fan.

* * * * *